US010862075B2

(12) United States Patent
Suga et al.

(10) Patent No.: US 10,862,075 B2
(45) Date of Patent: Dec. 8, 2020

(54) MANUFACTURING METHOD FOR EL DEVICE

(71) Applicant: Sharp Kabushiki Kaisha, Sakai (JP)

(72) Inventors: Katsuyuki Suga, Sakai (JP); Yuki Yasuda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 46 days.

(21) Appl. No.: 16/067,651

(22) PCT Filed: Mar. 30, 2017

(86) PCT No.: PCT/JP2017/013243
§ 371 (c)(1),
(2) Date: Jul. 2, 2018

(87) PCT Pub. No.: WO2018/179216
PCT Pub. Date: Oct. 4, 2018

(65) Prior Publication Data
US 2019/0363305 A1    Nov. 28, 2019

(51) Int. Cl.
H01L 51/56    (2006.01)
H01L 51/52    (2006.01)

(52) U.S. Cl.
CPC .......... H01L 51/56 (2013.01); H01L 51/5253 (2013.01)

(58) Field of Classification Search
CPC .................................................. H01L 51/5253
See application file for complete search history.

(56) References Cited

U.S. PATENT DOCUMENTS

| 10,374,160 | B2 * | 8/2019  | Tanaka ............... H05B 33/04 |
| 10,497,887 | B1 * | 12/2019 | Kishimoto ............ G09F 9/30  |
| 2003/0047280 | A1 | 3/2003  | Takayama et al. |
| 2015/0069358 | A1 | 3/2015  | Chida et al. |
| 2015/0210048 | A1 | 7/2015  | Jeong et al. |
| 2017/0194605 | A1 * | 7/2017 | Kuji .................. H01L 51/56 |

(Continued)

FOREIGN PATENT DOCUMENTS

JP    2003-163338 A    6/2003
JP    2015-109258 A    6/2015

(Continued)

OTHER PUBLICATIONS

Official Communication issued in International Patent Application No. PCT/JP2017/013243, dated Jun. 13, 2017.

Primary Examiner — Abul Kalam
(74) Attorney, Agent, or Firm — Keating & Bennett, LLP

(57) ABSTRACT

A manufacturing method for an EL device including a mother substrate and a layered body including a light emitting element, the method includes irradiating a laser beams to peel the mother substrate and the layered body from each other, wherein the mother substrate and the layered body contact with each other via a resin layer of the layered body, a protection material is formed on a face of the layered body, the face of the layered body not contacting with the mother substrate, the irradiating includes irradiating a first laser beam and a second laser beam after the first laser beam, and an absorption rate of the second laser beam irradiation by the resin layer is greater than an absorption rate of the second laser beam irradiation by the protection material.

19 Claims, 6 Drawing Sheets

(56) References Cited

U.S. PATENT DOCUMENTS

2019/0058121 A1* 2/2019 Tanaka ................ H01L 51/0097
2019/0363264 A1* 11/2019 Kishimoto .............. H01L 51/50

FOREIGN PATENT DOCUMENTS

| JP | 2015-530283 A | 10/2015 |
| JP | 2015-195140 A | 11/2015 |
| JP | 2017-024368 A | 2/2017 |

* cited by examiner

MANUFACTURING METHOD FOR EL DEVICE

TECHNICAL FIELD

The present disclosure relates to EL devices including an Electro Luminescence element (EL element).

BACKGROUND ART

When manufacturing a flexible EL device including an EL element, it is necessary to peel a mother substrate and a resin layer formed on the mother substrate from each other.

CITATION LIST

Patent Literature

PTL 1: JP 2015-530283 T (Publication Date: Oct. 15, 2015)
PTL 2: JP 2015-195140 A (Publication Date: Nov. 5, 2015)

SUMMARY

Technical Problem

The present disclosure relates to suppressing a decrease in yield and an subsequent increase in a manufacturing cost which occurs when peeling a mother substrate and a resin layer formed on the mother substrate from each other.

Solution to Problem

A manufacturing method for an EL device according to one aspect of the present disclosure includes a manufacturing method for an EL device including a mother substrate and layered body including a light emitting element. The method includes irradiating a laser beam to peel the mother substrate and the layered body from each other, wherein the mother substrate and the layered body contact with each other via a resin layer of the layered body, a protection material is formed on a face of the layered body, the face of the layered body not contacting with the mother substrate, the irradiating includes irradiating a first laser beam and then irradiating a second laser beam and, an absorption rate of the second laser beam by the resin layer is greater than an absorption rate of the second laser beam by the protection material.

Advantageous Effects of Disclosure

According to one aspect of the present disclosure, when peeling a mother substrate and a resin layer formed on the mother substrate from each other, it is possible to suppress a decrease in yield and an increase in a manufacturing cost.

BRIEF DESCRIPTION OF DRAWINGS

FIG. 3A illustrates a state before step S7, FIG. 3B illustrates a state in step S7, FIG. 3C illustrates a state in preprocessing of step S8, and FIG. 3D illustrates a state in step S8.

FIG. 4A illustrates a lateral insertion of a knife after an LLO process, FIG. 4B illustrates a vertical cut by a knife after the LLO process, and FIG. 4C illustrates a vertical cut by a laser beam after the LLO process.

FIG. 6A illustrates a top view of a substrate, FIG. 6B illustrates a cross-sectional view taken along a line C-C in FIG. 6A, FIG. 6C illustrates a state after peeling a mother substrate, and FIG. 6D illustrates a state after applying a support material.

DESCRIPTION OF EMBODIMENTS

Figure 1:
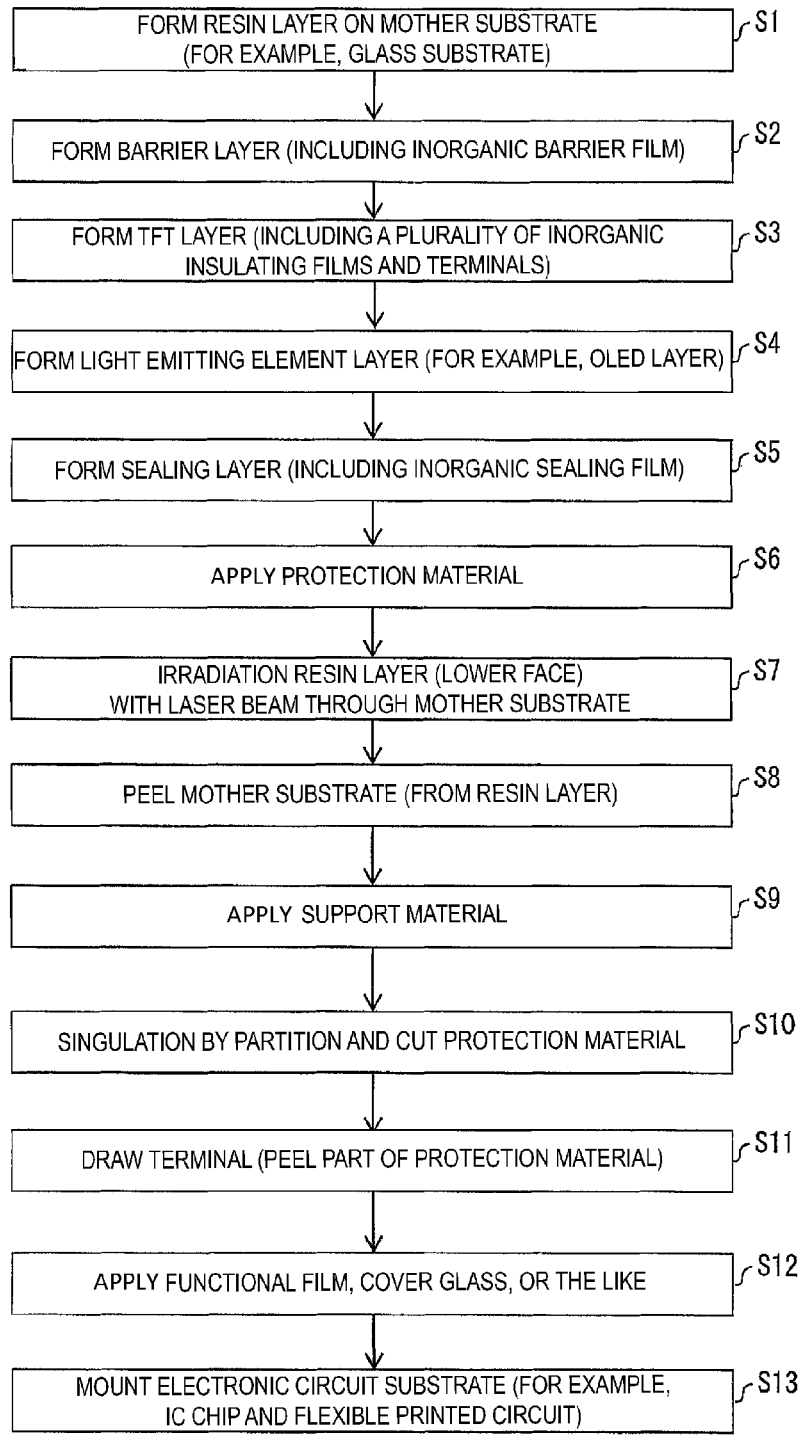
FIG. 1 is a flowchart illustrating an example of an EL device manufacturing method.
Figure 2A:
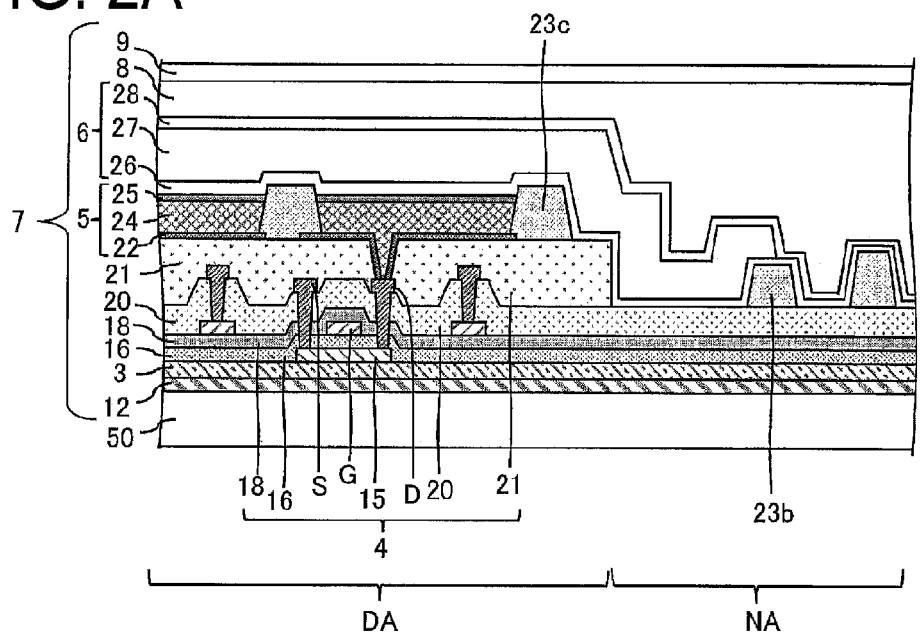
FIG. 2A is a cross-sectional view illustrating a configuration example of the EL device of the present embodiment during a formation of the EL device.
Figure 2B:
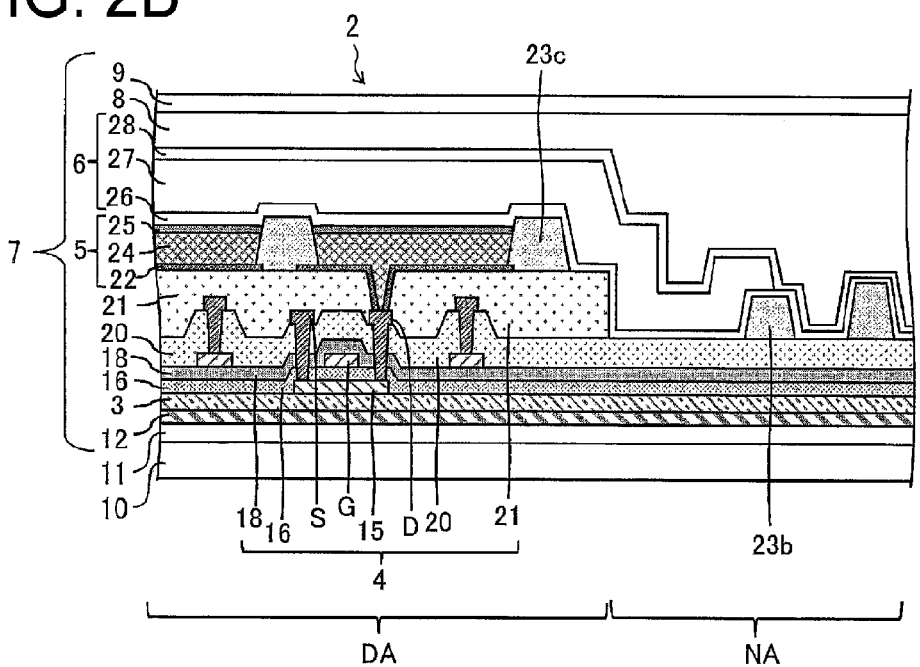
FIG. 2B is a cross-sectional view illustrating a configuration example of the EL device of the present embodiment.

FIG. 1 is a flowchart illustrating an example of a manufacturing method of an EL device. FIG. 2A is a cross-sectional view illustrating a configuration example of the EL device of the present embodiment during a formation of the EL device. FIG. 2B is a cross-sectional view illustrating a configuration example of the EL device of the present embodiment.

When manufacturing a flexible EL device, as illustrated in FIG. 1 and FIGS. 2A and 2B, first, a resin layer 12 is formed on a transparent mother substrate (for example, a glass substrate) 50 (step S1). Next, an inorganic barrier film 3 is formed (step S2). Then, a TFT layer 4 including a plurality of inorganic insulating films 16, 18, and 20 and a flattening film 21 is formed (step S3). Then, a light emitting element layer (for example, an OLED element layer) 5 is formed (step S4). Then, a sealing layer 6 including a first inorganic sealing film 26, a second inorganic sealing film 28, and an organic sealing film 27 is formed (step S5). Then, a protection material 9 (for example, a PET film) is applied on the sealing layer 6 with an adhesive layer 8 interposed therebetween (step S6).

Next, the resin layer 12 is irradiated with a laser beam (step S7). In this step, by the resin layer 12 absorbs the emitted laser beam, and a lower face of the resin layer 12 (an interface with the mother substrate 50) is modified with the ablation and a peeling layer 13 (see FIG. 3B, which will be described later) is formed, and therefore a coupling force between the resin layer 12 and the mother substrate 50 lowers. Subsequently, the mother substrate 50 is peeled from the resin layer 12 (step S8. See FIG. 3D, which will be described later). Subsequently, a layered body 7 and the mother substrate 50 illustrated in FIG. 2A are peeled from each other.

The manufacturing method for an EL device according to one aspect of the present disclosure is particularly characterized in this step S8. This will be described in detail later.

Next, as illustrated in FIG. 2B, a support material 10 (for example, a PET film) is applied on the lower face of the resin layer 12 with an adhesive layer 11 interposed therebetween (step S9). Then, the mother substrate 50 is partitioned and the protection material 9 is cut to cut out a plurality of EL devices (step S10). Then, the protection material 9 on a terminal portion of the TFT layer 4 is peeled to draw the terminal (step S11). With this, an EL device 2 illustrated in FIG. 2B is obtained. Then, a functional film is applied (step S12), an electronic circuit substrate is mounted on the terminal portion with an anisotropic conductive film or the like (step S13). Note that, each of the steps is performed by a manufacturing device of the EL device.

Examples of a material of the resin layer 12 includes polyimide, epoxy, polyamide, or the like. Particularly, polyimide is preferred.

The inorganic barrier film 3 is a film for preventing moisture or impurities from reaching the TFT layer 4 or the light emitting element layer 5 when the EL device is used, and can be configured of a silicon oxide film, a silicon nitride film, or a silicon oxynitride film, or a layered film thereof, which is formed by CVD, for example. The thickness of the inorganic barrier film 3 is from 50 nm to 1500 nm, for example.

The TFT layer 4 includes a semiconductor film 15, the inorganic insulating film 16 (gate insulating film) formed on an upper side of the semiconductor film 15, a gate electrode G formed on an upper side of the gate insulating film 16, the inorganic insulating films 18 and 20 formed on an upper side of the gate electrode G, a source electrode S, a drain electrode D, and a terminal TM formed on an upper side of the inorganic insulating film 20, and the flattening film 21 formed on an upper side of the source electrode S and the drain electrode D. The semiconductor film 15, the inorganic insulating film 16, the gate electrode G, the inorganic insulating films 18 and 20, the source electrode S, and the drain electrode D configure a Thin Film Transistor (TFT). The terminal portion including a plurality of the terminals TM and terminal wirings TW used for connection with the electronic circuit substrate such as an IC chip, a flexible printed circuit, or the like is formed on an end portion of the TFT layer 4 (a non-active region NA). The terminals TM are connected to various types of wirings of the TFT layer 4 by the terminal wirings TW.

The semiconductor film 15 is, for example, configured of low-temperature polysilicon (LTPS) or an oxide semiconductor. The gate insulating film 16 can be configured of a silicon oxide (SiOx) film or a silicon nitride (SiNx) film, or a layered film thereof, which is formed by CVD, for example. The gate electrode G, the source electrode S, the drain electrode D, and the terminal are, for example, configured of a single layer film or a layered film of metal including at least one of aluminum (Al), tungsten (W), molybdenum (Mo), tantalum (Ta), chromium (Cr), titanium (Ti), and copper (Cu). Note that, in FIGS. 2A and 2B, although the thin film transistor including the semiconductor film 15 as a channel is illustrated by a top gate structure, a bottom gate structure may be configured (for example, in a case where the channel of the thin film transistor is an oxide semiconductor).

The inorganic insulating films 18 and 20 can be configured of a silicon oxide (SiOx) film or a silicon nitride (SiNx) film, or a layered film thereof, which is formed by CVD, for example. The flattening film 21 is an organic insulating film, and can be configured of a photosensitive organic material that can be applied such as polyimide, acrylic, or the like, for example.

The light emitting element layer 5 (for example, an organic light emitting diode layer) includes an anode electrode 22 formed on an upper side of the flattening film 21, a partition 23c defining a subpixel in an active region DA, a bank 23b formed in the non-active region NA, an electroluminescence (EL) layer 24 formed on an upper side of the anode electrode 22, and a cathode electrode 25 formed on an upper side of the EL layer 24, and a light emitting element (for example, an organic light emitting diode) is configured by the anode electrode 22, the EL layer 24, and the cathode electrode 25.

The partition 23c and the bank 23b can be formed in the same process, by using a photosensitive organic material that can be applied such as polyimide, epoxy, acrylic, or the like, for example. The bank 23b in the non-active region NA is formed on the inorganic insulating film 20. The bank 23b defines an edge of the organic sealing film 27.

The EL layer 24 is formed in a region surrounded by the partition 23c (subpixel region) by a vapor deposition or an ink-jet method. In a case where the light emitting element layer 5 is an organic light emitting diode (OLED) layer, the EL layer 24 is, for example, configured by layering a hole injecting layer, a hole transport layer, a light emitting layer, an electron transport layer, and an electron injecting layer, in this order from the bottom layer side.

The anode electrode (positive electrode) 22 is, for example, configured by layering an Indium Tin Oxide (ITO) and an alloy including Ag, and has light reflectivity. The cathode electrode 25 can be configured of transparent metal such as Indium Tin Oxide (ITO), Indium Zinc Oxide (IZO), or the like.

In a case where the light emitting element layer 5 is an OLED layer, holes and electrons recombine in the EL layer 24 by a drive current between the anode electrode 22 and the cathode electrode 25 and excitons generated with this fall to a ground state to emit light.

The light emitting element layer 5 is not limited to a case of configuring the OLED element, may configure an inorganic light emitting diode or a quantum dot light emitting diode.

The sealing layer 6 includes the first inorganic sealing film 26 covering the partition 23c and the cathode electrode 25, the organic sealing film 27 covering the first inorganic sealing film 26, and the second inorganic sealing film 28 covering the organic sealing film 27.

Each of the first inorganic sealing film 26 and the second inorganic sealing film 28, for example, can be configured of a silicon oxide film, a silicon nitride film, or a silicon oxynitride film, or a layered film thereof, which is formed by CVD. The organic sealing film 27 is a transparent organic insulating film thicker than the first inorganic sealing film 26 and the second inorganic sealing film 28, can be configured of a photosensitive organic material that can be applied such as polyimide, acrylic, or the like. For example, ink including such an organic material is applied by an ink-jet processing on the first inorganic sealing film 26, and then cured by irradiation with UV. The sealing layer 6 covers the light emitting element layer 5 to prevent foreign objects such as water, oxygen, or the like from entering into the light emitting element layer 5.

The protection material 9 is applied on the sealing layer 6 with the adhesive layer 8 interposed therebetween, and functions as a support material when the mother substrate 50 is peeled. The material of the protection material 9 includes polyethylene terephthalate (PET), or the like.

The support material 10 is applied on the lower face of the resin layer 12 after peeling the mother substrate 50 in order to produce an EL device having excellent flexibility, and the material thereof includes, for example, polyethylene terephthalate (PET), or the like.

The functional film has, for example, an optical compensation function, a touch sensor function, a protection function, and the like. The electronic circuit substrate is, for example, IC chips mounted on the plurality of terminals TM or a flexible printed wiring board (PWB).

Embodiment

Hereinafter, step S7 (irradiation with a laser beam) and step S8 (peeling the mother substrate) described above relating to the characteristics of the present disclosure will be described.

Figure 3A:
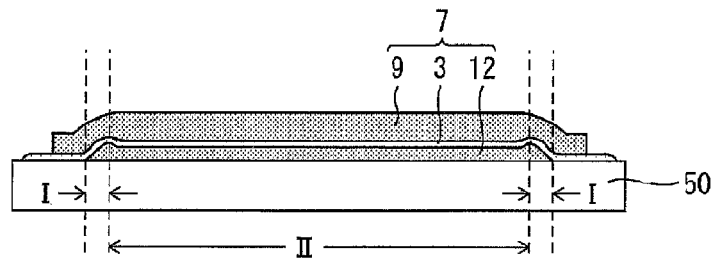
FIGS. 3A to 3D are cross-sectional views illustrating a configuration example of the EL device of the present embodiment during a formation of the EL device.
Figure 3B:
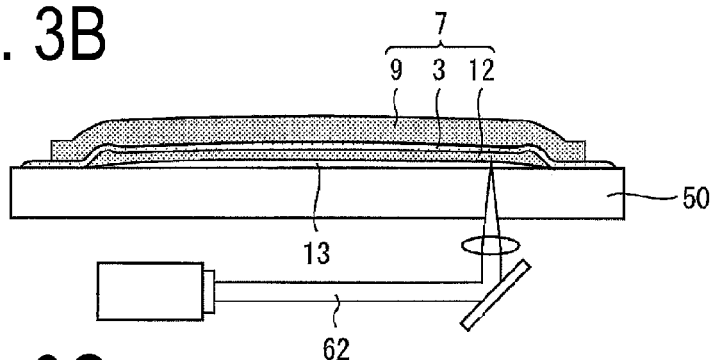
Figure 3C:
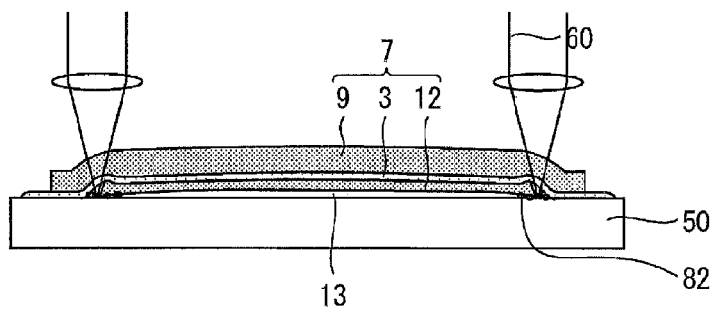
Figure 3D:
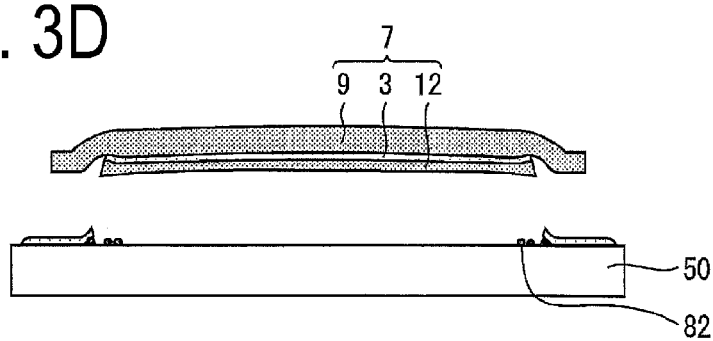

FIG. 3A to FIG. 3D are cross-sectional views illustrating a configuration example of an EL device of the present embodiment during a formation of the EL device, FIG. 3A illustrates a state before step S7, FIG. 3B illustrates a state in step S7, FIG. 3C illustrates a state in preprocessing of step S8, and FIG. 3D illustrates a state in step S8. FIGS. 3A to 3D illustrate the configuration example in which an EL layer is formed on the mother substrate 50. Note that, in FIGS. 3A to 3D, the EL layer or the like is not illustrated in detail, only the mother substrate 50, the resin layer 12, the inorganic barrier film 3, and the protection material 9 in FIG. 2A are illustrated.

As illustrated in FIG. 3A, in the configuration example before step S7, the resin layer 12 is formed on the mother substrate 50, the protection material 9 is formed on an outermost surface thereof with the EL layer or the like which is formed on the layer (not illustrated) interposed therebetween.

Step S7

Step S7 is a step in which, as a stage preceding step S8 in which the resin layer 12 is peeled from the mother substrate 50 (FIG. 3D), the resin layer 12 is irradiated with a laser beam. This step S7 is a so-called Laser Lift Off (LLO) step.

LLO Process

The LLO process corresponding to step S7 will be described with reference to FIG. 3B illustrating an overview of the LLO process. As illustrated in FIG. 3B, first, from a face of the mother substrate 50 on which the resin layer 12 is not formed, a UV laser beam 62 is emitted across almost the entire surface of the resin layer 12. Here, almost the entire surface of the resin layer 12 refers to the substantial entire surface of the resin layer 12 which is attempted to be peeled from the mother substrate 50, it is intended that a case where a portion which is not irradiated occurs in a part of the resin layer 12 is not excluded for reasons of mechanical accuracy, design, processes, or the like. By this irradiation with the UV laser beam 62, the resin layer 12 absorbs the emitted laser beam, the lower face of the resin layer 12 (the interface with the mother substrate 50) changes in quality by ablation to form the peeling layer 13. Then, by this peeling layer 13, the coupling force between the resin layer 12 and the mother substrate 50 lowers. Note that, as the UV laser beam, for example, a nanosecond oscillation laser beam such as an excimer laser or the like is used.

Note that, however, only by this LLO process, after the LLO process, an outer peripheral portion of the resin layer 12 such as polyimide or the like may not be completely peeled from the mother substrate 50 made from a glass substrate or the like.

Additional Process

Figure 4A:
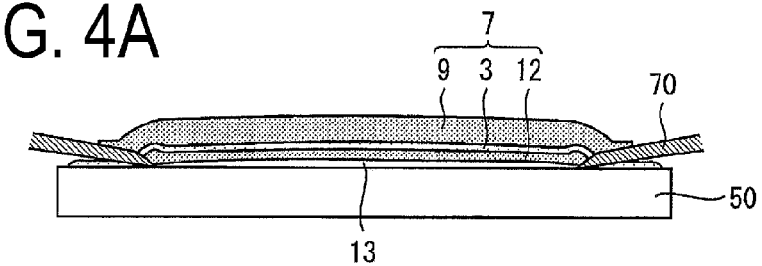
FIGS. 4A to 4C are cross-sectional views illustrating a configuration example of the EL device during a formation of the EL device.
Figure 4B:
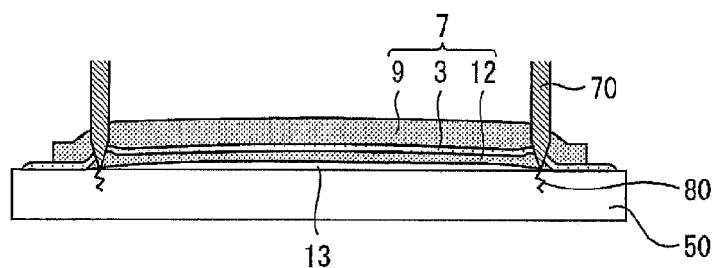
Figure 4C:
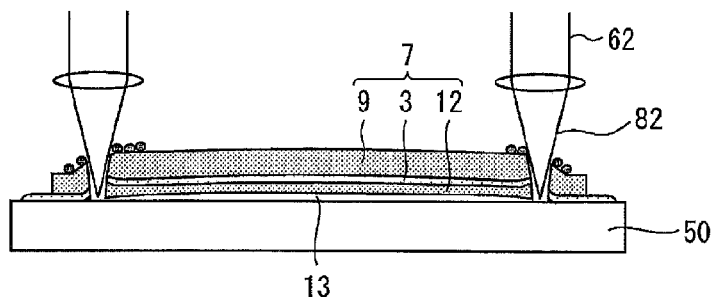

Accordingly, it is necessary for additional processes after the LLO process as illustrated in FIG. 4A to FIG. 4C (an additional cut process or the like) to be performed.

FIG. 4A illustrates, as the additional process, a process for inserting a knife 70 between the mother substrate 50 and the resin layer 12 in a lateral direction (a direction almost parallel to a surface of the mother substrate 50). In this process, for a reason of the slippery knife 70 or the like, it is difficult to accurately insert the knife 70 into the interface between the resin layer 12 and the mother substrate 50, and it is thus difficult to peel the resin layer 12 from the mother substrate 50 with a high yield.

FIG. 4B illustrates, as the additional process, a process for inserting the knife 70 from the surface of the protection material 9 in a vertical direction (a direction almost orthogonal to the surface of the mother substrate 50) to cut the resin layer 12. In this process, due to the hard mother substrate 50 in a layer under the soft film layer (the protection material 9, the resin layer 12, or the like), there is a problem that the knife 70 rapidly deteriorates. Additionally, it is not easy to control intensity when inserting the knife 70, there is a problem that cracks 80 are easy to occur in the mother substrate 50.

FIG. 4C illustrates, as the additional process, a process for emitting the UV laser beam 62 from the surface of the protection material 9 in the vertical direction. In this process, since both the protection material 9 and the resin layer 12 are cut, a large amount of particles 82 are generated. Accordingly, there is a problem that the yield is easy to drop.

Laser Beam Irradiation at Second Time

As opposed to this, a method described below is a method for cutting the resin layer 12 by irradiation with a laser beam 60. Hereinafter, this will be described with reference to FIG. 3C. FIG. 3C is a diagram illustrating a state of irradiation with a laser beam as the above-described additional process.

In the method of the present embodiment illustrated in FIG. 3C, after the process of step S7, the laser beam 60 is emitted in a direction from above the protection material 9 toward the mother substrate 50. After this laser beam irradiation at the second time, step S8 is performed.

Here, the present embodiment is characterized in a wavelength of the emitted laser beam 60. Specifically, a green laser beam (for example, 515 nm or 532 nm) or an infrared (IR) laser beam (for example, 1030 nm or 1064 nm) is used.

By using the laser beam with the wavelength, without cutting the protection material 9, the resin layer 12 can be selectively cut. The reason is as follows.

In the present embodiment, a polyethylene terephthalate (PET) film is used as the protection material 9, polyimide (PI) is used as the resin layer 12. Polyethylene terephthalate and polyimide have different laser beam absorption rates for the green laser beam and the infrared laser beam, polyimide has a higher absorption rate than that of polyethylene terephthalate. Accordingly, by the above-described irradiation with the laser beam, with almost no cutting or no changing in quality of the protection material 9 formed of polyethylene terephthalate, the resin layer 12 formed of polyimide can be selectively cut. Note that, as necessary, the intensity of the laser beam irradiation is preferably adjusted and set to intensity that only the resin layer 12 is cut without the protection material 9 being cut.

By adding the process using the laser beam after step S7, as illustrated in FIG. 3D, the resin layer 12 can preferably be peeled from the mother substrate 50 (step S8). At this time, as illustrated in FIG. 3D, the particles 82 are generated only from the resin layer 12 cut by the laser beam, are not generated from the protection material 9. Additionally, since the protection material 9 is not cut, the protection material 9 functions as a cover, and diffusion and scattering of the particles 82 generated from the resin layer 12 can be suppressed. Accordingly, the yield can be improved.

After cutting the resin layer 12 in a post-process of the laser beam irradiation illustrated in FIG. 3C, the mother substrate 50 is peeled from the resin layer 12 (step S8. FIG. 3D). With this, the layered body 7 and the mother substrate 50 illustrated in FIG. 2A are peeled from each other. In the present embodiment, step S8 can be performed in a state that the protection material 9 is not peeled and left layered as a part of the layered body 7. Accordingly, for example, after the laser beam irradiation, a transport mechanism with an air suction port in an arm sucks to the entire surface of the protection material 9 to take out the protection material 9 from the mother substrate 50, which makes it possible, at the same time, to peel and separate the layered body 7 bonded to the protection material 9 from the mother substrate 50. Step S8 will be described in detail later.

Laser Beam Irradiation

Figure 5:
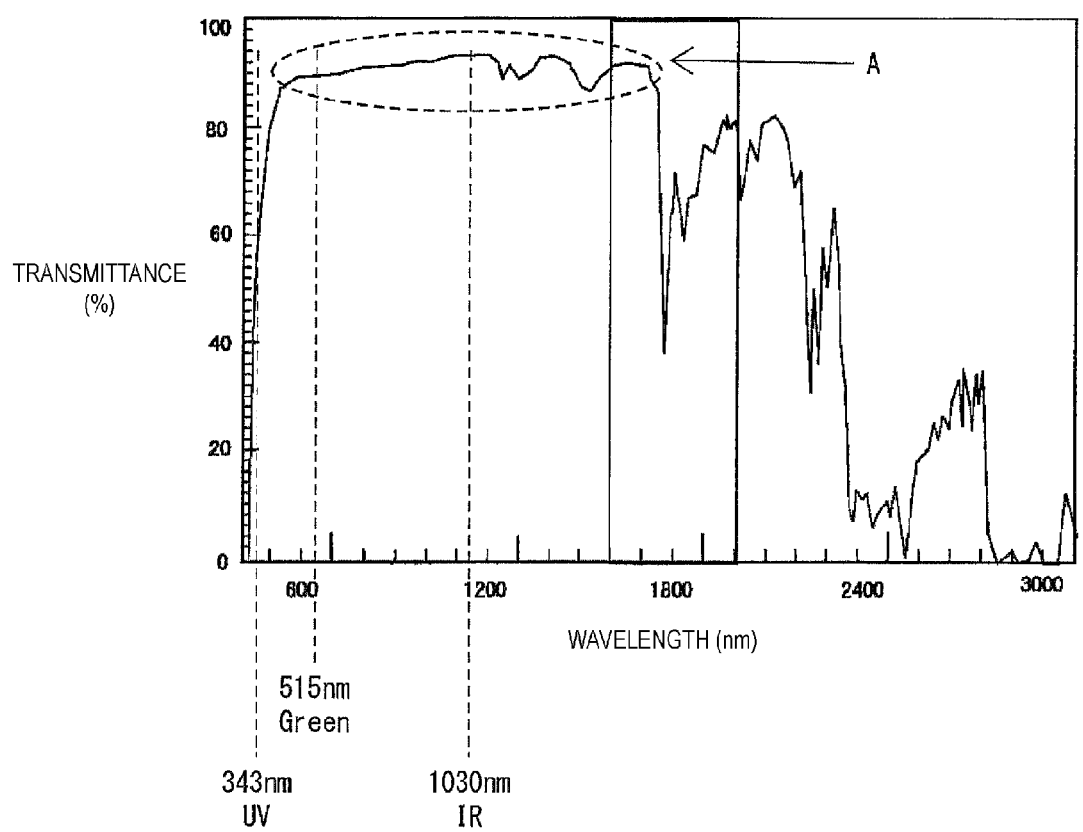
FIG. 5 is a graph illustrating a spectral transmittance of a polyethylene terephthalate film.

Next, the laser beam will be described in more detail. FIG. 5 is a graph illustrating a spectral transmittance of a polyethylene terephthalate film. As illustrated in FIG. 5, the polyethylene terephthalate film exhibits a high light transmittance to light in a long wavelength region with a wavelength from 450 to 1750 nm, particularly, a wavelength from 500 to 1700 nm (a portion A surrounded by a dotted line in FIG. 5). In other words, the polyethylene terephthalate film has a low light absorption rate to light in the wavelength region. On the other hand, polyimide has a high light absorption rate in the wavelength region.

Accordingly, in the configuration in which polyethylene terephthalate is used as the protection material 9, and polyimide is used as the resin layer 12, by performing step S7 using the laser beam with the wavelength from 450 to 1750 nm, particularly, the wavelength from 500 to 1700 nm, the resin layer 12 can be selectively cut.

Here, the wavelength of the laser beam is not particularly limited as long as the wavelength is in the above range, for example, a blue laser beam (for example, 458 nm) can be used other than the green laser beam and the infrared laser beam.

Additionally, although a pulse width of the laser beam to be used is not also particularly limited, a picosecond oscillation laser beam or a femtosecond oscillation laser beam is preferably used.

Effects

As described above, by adding a process using the laser beam after step S7, the additional process using the knife 70 illustrated in FIG. 4A to FIG. 4B is not needed.

Accordingly, a problem due to use of the knife 70 (deterioration of the knife 70, occurrence of the cracks in the mother substrate 50, or the like) does not arise. Additionally, maintenance such as replacement of the knife (edge) 70, or the like and a complicated adjustment of process conditions are not needed.

Furthermore, a drop in the yield by a large amount of the particles 82 being generated does not occur in comparison with the method in which the resin layer is cut along with the protection material illustrated in FIG. 4C.

As described above, with the method of the embodiment in which the laser beam is emitted twice, it is possible to realize improvement of the yield and improvement of a device operation rate.

Variation of Laser Beam Irradiation

In the embodiment, as illustrated in FIG. 3C, the laser beam 60 is emitted from the protection material 9 toward the resin layer 12. The laser beam 60 can also be emitted from a face of the mother substrate 50 on which the resin layer 12 is not formed.

Additionally, the entire periphery of the region to be peeled need not be irradiated with the laser beam 60, in a case where a region to be peeled has a quadrangular shape, for example, only one side thereof can be irradiated.

Furthermore, the irradiation with the laser beam 60 is preferably performed for a region from a position where the thickness of the resin layer 12 starts to decrease to a position where the resin layer 12 does not exist (a region indicated by an arrow I in FIG. 3A), in other words, a region in which the thickness of the resin layer 12 is less than a flat portion (a region indicated by an arrow II in FIG. 3A). In other words, it is preferable to irradiate a laser to a region I proximate to the end portion of the resin layer 12 and in which the thickness of the resin layer 12 is less than the thickness of the flat portion II of the resin layer 12. Here, a region proximate to the end portion of the resin layer 12 refers to the periphery portion of the resin layer 12. Even if the resin layer 12 partially includes a region whose thickness is thin in the central portion of the resin layer 12 due to some factors, for example, the part is intended not to be included. For example, the region proximate to the end portion of the resin layer 12 refers to a region within 5 mm from an edge side of the resin layer 12.

In this case, since the thickness of the resin layer 12 is thin, the resin layer 12 can be selectively cut with ease. Additionally, since the resin layer 12 can be cut at a place near the end portion, a substrate size is not excessively reduced, and thus reduction in the number of obtained panels can be suppressed.

Variation on Material

In the embodiment, polyethylene terephthalate is used as the protection material 9, and polyimide is used as the resin layer 12. However, the materials of the protection material 9 and the resin layer 12 are not limited thereto.

In accordance with a combination of the materials to be used, in the protection material 9 and the resin layer 12, a laser beam wavelength may be selected such that the resin layer 12 has a higher absorption rate of the laser beam than that of the protection material 9. Additionally, the intensity of the laser beam irradiation may be set to intensity at which the protection material 9 is not cut, and only the resin layer 12 is cut.

With this, regardless of the materials of the protection material 9 and the resin layer 12, the resin layer 12 can preferably be peeled from the mother substrate 50.

Laser Beam Irradiation at Two Times

As described above, in the present embodiment, the laser beam irradiation is performed twice for the layered body 7. The laser beam irradiation at the first time (first laser beam irradiation) is, as step S7 illustrated in FIG. 3B, irradiation of the layered body 7, particularly, the entire surface of the resin layer 12 with the laser beam. In this laser beam irradiation, a UV laser beam is used, and the layered body 7 is peeled from the mother substrate 50 as a whole.

As opposed to this, the laser beam irradiation at the second time (second laser beam irradiation) is irradiation of the end portion of the layered body 7 with the laser beam, and the end portion or the edge portion of the layered body 7 is cut with this irradiation. In this laser beam irradiation, a green laser beam, an infrared laser beam, or the like is used.

Additionally, in a typical example, a nanosecond oscillation laser beam is emitted from the mother substrate 50 side in the laser beam irradiation at the first time, whereas light having a shorter pulse width than the first-time irradiation such as picosecond oscillation laser or the like is emitted from the protection material 9 side in the laser beam irradiation at the second time.

Step S8

Figure 6A:
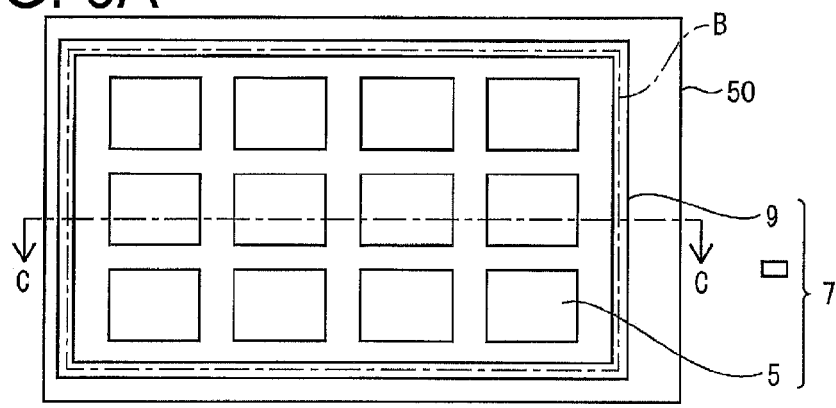
FIGS. 6A to 6D are cross-sectional views illustrating a configuration example of the EL device during a formation of the EL device.
Figure 6B:
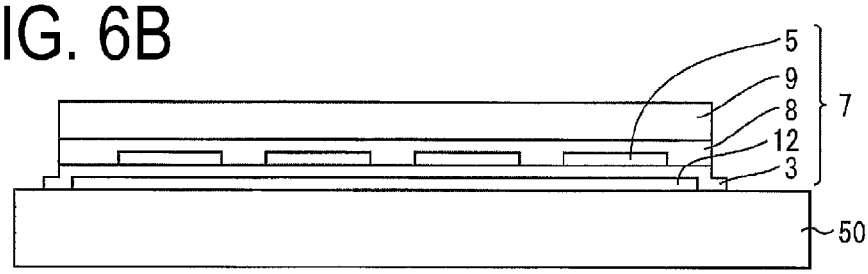
Figure 6C:
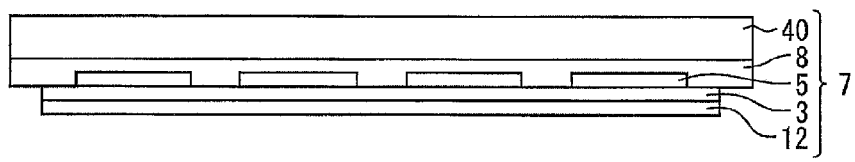
Figure 6D:
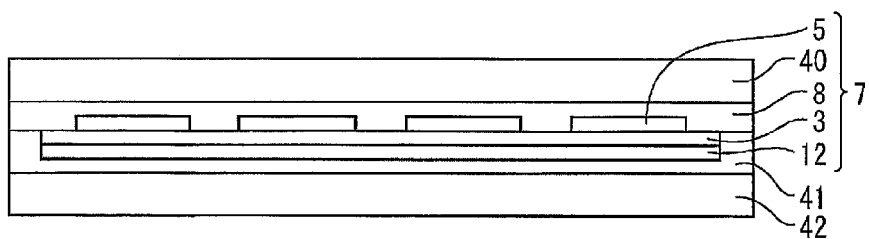

A state of peeling the layered body 7 and the mother substrate 50 from each other and step S8 will be described in detail with reference to FIG. 6A to FIG. 6D. FIG. 6A to FIG. 6D are cross-sectional views illustrating a configuration example of the EL device during a formation of the EL device, FIG. 6A illustrates a top view of the substrate, FIG. 6B illustrates a cross-sectional view taken along a line C-C in FIG. 6A, FIG. 6C illustrates a state after peeling the mother substrate, and FIG. 6D illustrates a state after applying the support material.

As illustrated in FIG. 6A and FIG. 6C, on the mother substrate 50, a plurality of display panels including a plurality of the light emitting element layers 5 are formed. In the present embodiment, the resin layer 12 is partitioned at a line illustrated by a dot-dash line B in FIG. 6A by the laser beam irradiation at the second time. At this time, the protection material 9 is not partitioned. Accordingly, as illustrated in FIG. 6C, the end face of the resin layer 12 and the end face of the protection material or a first laminate layer 40 do not align, the configuration in which the first laminate layer 40 projects from the resin layer 12 is obtained. In other words, the protection material 9 or the first laminate layer 40 is greater than the resin layer 12 when viewed in a plan view. Accordingly, as illustrated in FIG. 6D, in a case where a second laminate layer 42 is layered on the resin layer 12 with an adhesive layer 41 interposed therebetween instead of the peeled mother substrate 50, the first laminate layer 40 and the second laminate layer 42 are formed to have the same size with ease. In a case where the first laminate layer 40 and the second laminate layer 42 can be formed having the same size in this manner, the second laminate layer 42 is applied on the resin layer 12 with ease, and layered object after sticking is handled with ease. Note that, the first laminate layer 40 and the second laminate layer 42 are collective names of layers respectively provided on an upper side face (the protection material 9 side) and a lower side face (the mother substrate 50 side) of a panel 5, and include a protection layer, a support layer, a functional layer, or the like.

Additionally, a flexible display according to the present embodiment is not particularly limited as long as the flexible display is a flexible display panel including a bendable light emitting element. The above-described light emitting element is a light emitting element whose luminance and transmittance are controlled by current, a light emitting element controlled by current includes an organic Electroluminescence (EL) display including an Organic Light Emitting Diode (OLED), a QLED display including EL display Quantum dot Light Emitting Diode (QLED) such as an inorganic EL display including an inorganic light emitting diode, or the like.

Supplement

A method for an EL device according to a first aspect of the present disclosure is a method for manufacturing an EL device including a mother substrate and a layered body including a light emitting element, the method includes irradiating a laser beam to peel the mother substrate and the layered body from each other, wherein the mother substrate and the layered body make contact with each other via a resin layer of the layered body, a protection material is formed on a face of the layered body not making contact with the mother substrate, the irradiating includes irradiating a first laser beam and then irradiating a second laser beam, and an absorption rate of the second laser beam by the resin layer is greater than an absorption rate of the second laser beam by the protection material.

The manufacturing method for an EL device according to a second aspect of the present disclosure includes setting an intensity of the laser beam to a level such that the irradiating a second laser beam does not cut the protection material and cut the resin layer.

In the manufacturing method for an EL device according to a third aspect of the present disclosure, the irradiating a second laser beam is performed on a region proximate to an end portion of the resin layer and a thickness of the region is less than a thickness of a flat portion of the resin layer.

In the manufacturing method for an EL device according to a fourth aspect of the present disclosure, the irradiating a first laser beam is performed substantially all over a surface of the resin layer.

In the manufacturing method for an EL device according to a fifth aspect of the present disclosure, the irradiating a first laser beam causes the resin layer and the mother substrate peeled from each other, and the irradiating a second beam causes the region proximate to the end portion cut.

In the manufacturing method for an EL device according to a sixth aspect of the present disclosure, in the irradiating a first laser beam, irradiation is performed from the mother substrate toward the resin layer, and in the second laser beam irradiation, irradiation is performed from the protection material toward the resin layer.

In the manufacturing method for an EL device according to a seventh aspect of the present disclosure, in the irradiating a second laser beam, a part of a periphery of the resin layer is irradiated.

The manufacturing method for an EL device according to an eighth aspect of the present disclosure further includes, after the irradiating a second laser beam, sucking a surface of the protection material cutting off the protection material from the mother substrate such that the layered body bonded to the protection material is peeled from the mother substrate.

In the manufacturing method for an EL device according to a ninth aspect of the present disclosure, after the peeling, the protection material is greater than the layered body when viewed in a plan view.

In the manufacturing method for an EL device according to a tenth aspect of the present disclosure, the layered body includes an inorganic film between the light emitting element layer and the resin layer, the inorganic film is formed such that the inorganic film covers the entire surface of the resin layer.

In the manufacturing method for an EL device according to an eleventh aspect of the present disclosure, the resin layer is formed of polyimide, the protection material is formed of polyethylene terephthalate.

In the manufacturing method for an EL device according to a twelfth aspect of the present disclosure, a wavelength of a laser beam in the irradiating a second laser beam is from 450 nm to 1750 nm.

In the manufacturing method for an EL device according to a thirteenth aspect of the present disclosure, a wavelength of a laser beam in the second laser beam irradiation is from 500 nm to 1700 nm.

In the manufacturing method for an EL device according to a fourteenth aspect of the present disclosure, a laser beam of the irradiating a second laser beam is at least one of a blue laser beam, a green laser beam, and an infrared laser beam.

In the manufacturing method for an EL device according to a fifteenth aspect of the present disclosure, a laser beam of the irradiating a first laser beam is a UV laser beam.

In the manufacturing method for an EL device according to a sixteenth aspect of the present disclosure, a laser beam of the irradiating a second laser beam is at least one of a picosecond oscillation laser beam and a femtosecond oscillation laser beam.

In the manufacturing method for an EL device according to a seventeenth aspect of the present disclosure, a laser beam of the irradiating a first laser beam is a nanosecond oscillation laser beam.

Supplementary Notes

The present disclosure is not limited to the embodiment stated above. Embodiments obtained by appropriately combining technical approaches stated in each of the different embodiments also fall within the scope of the technology of the present disclosure. Moreover, novel technical features may be formed by combining the technical approaches stated in each of the embodiments.

REFERENCE SIGNS LIST

2 EL device
4 TFT layer
3 Inorganic barrier film
5 Light emitting element layer
6 Sealing layer
7 Layered body
8, 11 Adhesive layer
9 Protection material
10 Support material
12 Resin layer
13 Peeling layer
15 Semiconductor film
16 Gate insulating film
16, 18, 20 Inorganic insulating film
21 Flattening film
22 Anode electrode
23b Bank
23c Partition
24 EL layer
25 Cathode electrode
26 First inorganic sealing film
26, 28 Inorganic sealing film
27 Organic sealing film
28 Second inorganic sealing film
39 Functional film
40 First laminate layer
41 Adhesive layer
42 Second laminate layer
50 Mother substrate
60 Laser beam (blue laser beam, green laser beam, IR laser beam)
62 UV laser beam
70 Knife
80 Crack
82 Particle

The invention claimed is:

1. A manufacturing method for an electro-luminescence (EL) device, the method comprising:
    forming a layered body on a mother substrate, the layered body including a resin layer and a light emitting element, the resin layer contacting the mother substrate, and the light emitting element provided above the resin layer; and
    irradiating a laser beam to peel the mother substrate and the resin layer of the layered body contacting the mother substrate from each other, wherein
    a protection material is formed on a surface of the layered body, the surface of the layered body not contacting the mother substrate,
    the irradiating includes irradiating a first laser beam over an interface between the resin layer and the mother substrate so that a coupling force between the resin layer and the mother substrate lowers and then irradiating a second laser beam, and
    an absorption rate of the second laser beam by the resin layer is greater than an absorption rate of the second laser beam by the protection material.

2. The manufacturing method for an EL device according to claim 1, further comprising setting an intensity of the second laser beam to a level such that the irradiating the second laser beam does not cut the protection material and cut the resin layer.

3. The manufacturing method for an EL device according to claim 1, wherein
    the irradiating the second laser beam is performed on a region proximate to an end portion of the resin layer, and
    a thickness of the region is less than a thickness of a flat portion of the resin layer.

4. The manufacturing method for an EL device according to claim 1, wherein the irradiating the first laser beam is performed substantially all over a surface of the resin layer.

5. The manufacturing method for an EL device according to claim 1, wherein
    the irradiating the first laser beam allows the resin layer and the mother substrate to be peeled from each other, and
    the irradiating the second laser beam causes a region proximate to an end portion of the resin layer to be cut.

6. The manufacturing method for an EL device according to claim 1, wherein,
    the irradiating the first laser beam is performed from the mother substrate toward the resin layer, and
    the irradiating the second laser beam is performed from the protection material toward the resin layer.

7. The manufacturing method for an EL device according to claim 1, wherein, the irradiating the second laser beam includes irradiating a portion of a periphery of the resin layer.

8. The manufacturing method for an EL device according to claim 1, further comprising, after the irradiating the second laser beam, suctioning a surface of the protection material such that the layered body bonded to the protection material is peeled from the mother substrate.

9. The manufacturing method for an EL device according to claim 8, wherein, after peeling the layered body from the mother substrate, an area of the protection material is greater than the layered body when viewed in a plan view.

10. The manufacturing method for an EL device according to claim 1, wherein the layered body includes an inorganic film between the light emitting element layer and the resin layer, the inorganic film is formed such that the inorganic film covers an entire surface of the resin layer.

11. The manufacturing method for an EL device according to claim 1, wherein the resin layer is formed of polyimide, the protection material is formed of polyethylene terephthalate.

12. The manufacturing method for an EL device according to claim 1, wherein a wavelength of a laser beam in the irradiating the second laser beam is from 450 nm to 1750 nm or less.

13. The manufacturing method for an EL device according to claim 1, wherein a wavelength of a laser beam in the irradiating the second laser beam is from 500 nm to 1700 nm.

14. The manufacturing method for an EL device according to claim 1, wherein a laser beam of the irradiating the second laser beam is at least one of a blue laser beam, a green laser beam, and an infrared laser beam.

15. The manufacturing method for an EL device according to claim 1, wherein a laser beam of the irradiating the first laser beam is an ultraviolet (UV) laser beam.

16. The manufacturing method for an EL device according to claim 1, wherein a laser beam of the irradiating the second laser beam is at least one of a picosecond oscillation laser beam and a femtosecond oscillation laser beam.

17. The manufacturing method for an EL device according to claim 1, wherein a laser beam of the irradiating the first laser beam is a nanosecond oscillation laser beam.

18. The manufacturing method for an EL device according to claim 1, wherein the mother substrate is a single mother substrate.

19. The manufacturing method for an EL device according to claim 1, wherein the second laser beam is a green laser beam or an infrared laser beam that can selectively cut the resin layer without cutting the protection material.

* * * * *